(12) United States Patent
Yang et al.

(10) Patent No.: US 9,166,109 B2
(45) Date of Patent: Oct. 20, 2015

(54) SEMICONDUCTOR LIGHT EMITTING ELEMENT, AND LIGHT EMITTING DEVICE HAVING CONDUCTIVE VIAS OF FIRST ELECTRODE STRUCTURE DISPOSED BELOW SECOND PAD ELECTRODE OF SECOND ELECTRODE STRUCTURE

(71) Applicant: SAMSUNG ELECTRONICS CO., LTD., Suwon-Si, Gyeonggi-Do (KR)

(72) Inventors: Jong In Yang, Suwon-si (KR); Tae Hyung Kim, Seongnam-si (KR); Kwang Min Song, Suwon-si (KR); Seung Hwan Lee, Suwon-si (KR); Wan Tae Lim, Suwon-si (KR); Se Jun Han, Suwon-si (KR); Hyun Kwon Hong, Cheonan-si (KR); Su Min Hwangbo, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 146 days.

(21) Appl. No.: 13/900,268

(22) Filed: May 22, 2013

(65) Prior Publication Data
US 2013/0334552 A1      Dec. 19, 2013

(30) Foreign Application Priority Data

Jun. 13, 2012    (KR) ........................ 10-2012-0063259

(51) Int. Cl.
*H01L 33/38* (2010.01)
*H01L 33/40* (2010.01)
(Continued)

(52) U.S. Cl.
CPC ............ *H01L 33/382* (2013.01); *H01L 33/405* (2013.01); *H01L 33/44* (2013.01); *H01L 33/62* (2013.01); *H01L 33/38* (2013.01); *H01L 2924/0002* (2013.01)

(58) Field of Classification Search
CPC ...... H01L 33/382; H01L 33/405; H01L 33/62
See application file for complete search history.

(56) References Cited

U.S. PATENT DOCUMENTS

| 6,841,808 B2 * | 1/2005 | Shibata et al. ................ 257/190 |
| 2006/0157717 A1 * | 7/2006 | Nagai et al. .................... 257/81 |

(Continued)

FOREIGN PATENT DOCUMENTS

| JP | 2011-199193 | 10/2011 |
| KR | 10-2005-0032968 | 4/2005 |
| KR | 10-2006-0104714 | 10/2006 |

OTHER PUBLICATIONS

English Abstract for Publication No. 10-2005-0032968.
(Continued)

*Primary Examiner* — Thanh V Pham
(74) *Attorney, Agent, or Firm* — F. Chau & Associates, LLC

(57) ABSTRACT

A semiconductor light emitting element includes a light emitting structure including a first conductivity type semiconductor layer, an active layer and a second conductivity type semiconductor layer. A first electrode structure includes a conductive via connected to the first conductivity type semiconductor layer. A second electrode structure is connected to the second conductivity type semiconductor layer. An insulating part having an open region exposes part of the first and second electrode structures while covering the first and second electrode structures. First and second pad electrodes are formed on the first and second electrode structures exposed by the open region and are connected to the first and second electrode structures.

19 Claims, 14 Drawing Sheets

(51) Int. Cl.
*H01L 33/44* (2010.01)
*H01L 33/62* (2010.01)

(56) References Cited

U.S. PATENT DOCUMENTS

2008/0096297 A1* 4/2008 Schiaffino et al. .............. 438/22

2010/0012963 A1 1/2010 Hwan

OTHER PUBLICATIONS

English Abstract for Publication No. 10-2006-0104714.
English Abstract for Publication No. 2011-199193.

* cited by examiner

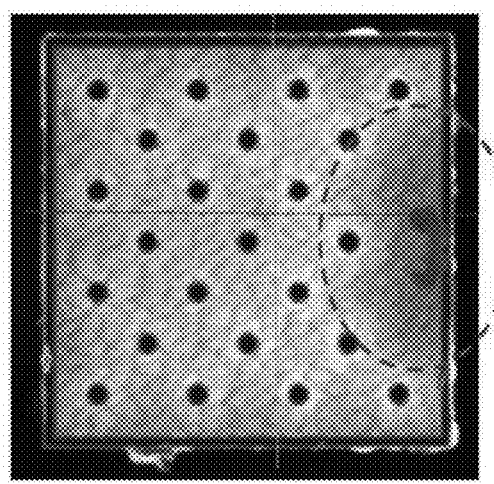 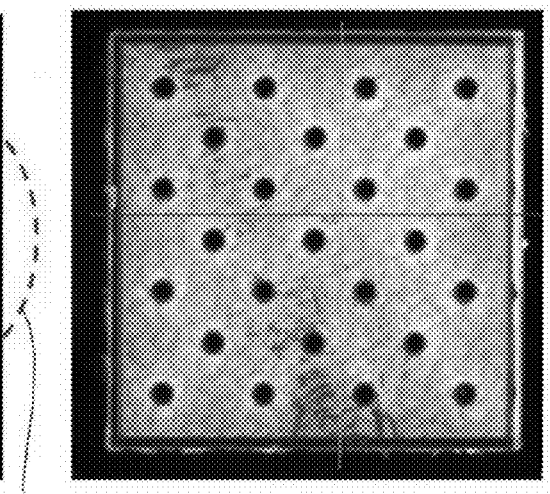
FIG. 12A  'A'  FIG. 12B

SEMICONDUCTOR LIGHT EMITTING ELEMENT, AND LIGHT EMITTING DEVICE HAVING CONDUCTIVE VIAS OF FIRST ELECTRODE STRUCTURE DISPOSED BELOW SECOND PAD ELECTRODE OF SECOND ELECTRODE STRUCTURE

CROSS-REFERENCE TO RELATED APPLICATIONS

This application claims priority to Korean Patent Application No 10-2012-0063259 filed on Jun. 13, 2012, in the Korean Intellectual Property Office, the disclosure of which is incorporated herein by reference.

TECHNICAL FIELD

The present invention relates to a light emitting element, and more particularly, to a semiconductor light emitting element, a light emitting device, and a method of manufacturing the semiconductor light emitting element.

DISCUSSION OF THE RELATED ART

Nitride semiconductors have been widely used in green and blue light emitting diodes (LEDs) and laser diodes (LDs) where the LEDs and LDs are provided as light sources in full-color display devices, image scanners, various signaling systems, and optical communications devices. A nitride semiconductor light emitting device may be provided as a light emitting device having an active layer capable of emitting various wavelengths of light, including blue light and green light, through the principle of electron-hole recombination in which electrons and holes are recombined.

Research into the use of nitride semiconductor light emitting devices in general illumination apparatuses and as light sources for electrical apparatuses has been conducted. In particular, a nitride semiconductor light emitting devices have been used in a low current/low output mobile product. Recently, as the range of applications of nitride semiconductor light emitting devices has been gradually expanded to a high current/high output field, research into increasing the quality and light emitting efficiency of semiconductor light emitting devices has been actively conducted. In particular, light emitting devices having various electrode structures have been developed to increase the light output and reliability thereof.

SUMMARY OF THE INVENTION

An aspect of the present invention provides a semiconductor light emitting element allowing for an increased degree of freedom in designing electrodes and more balanced current distribution.

An aspect of the present invention also provides a semiconductor light emitting element having a reduced operating voltage and increased light output.

An aspect of the present invention also provides a light emitting device having increased reliability and desired heat radiation characteristics.

An aspect of the present invention also provides a method of manufacturing a semiconductor light emitting element allowing for a more easily adaptable design.

According to an aspect of the present invention, there is provided a semiconductor light emitting element including a light emitting structure. The light emitting structure includes a first conductivity type semiconductor layer, an active layer and a second conductivity type semiconductor layer. A first electrode structure includes a conductive via penetrating the second conductivity type semiconductor layer and the active layer and connected to the first conductivity type semiconductor layer. A second electrode structure is connected to the second conductivity type semiconductor layer. An insulating part having an open region exposes part of the first and second electrode structures while covering the first and second electrode structures. First and second pad electrodes are formed on the first and second electrode structures exposed by the open region and are connected to the first and second electrode structures.

The first and second pad electrodes may have substantially the same area.

The first electrode structure may be disposed below the second pad electrode.

The insulating part may be disposed between the second pad electrode and the first electrode structure.

The conductive via may include a plurality of conductive vias, and the insulating part may fill spaces between the plurality of conductive vias and the light emitting structure.

The first and second electrode structures may be disposed in the same direction.

The first electrode structure may be surrounded by the insulating part and may be electrically separated from the active layer and the second conductivity type semiconductor layer.

At least part of the second electrode structure may be formed of a light reflective material.

At least part of the second electrode structure may be formed surrounding the conductive via.

The semiconductor light emitting element may further include a substrate. The first conductivity type semiconductor layer, the active layer, and the second conductivity type semiconductor layer are each sequentially formed thereon.

The substrate may include first and second main surfaces facing each other. The light emitting structure may be disposed on the first main surface. The substrate may include an uneven structure formed on at least one of the first and second main surfaces.

The uneven structure formed on the substrate may include a concave portion having an inclined lateral surface.

According to an aspect of the present invention, there is provided a light emitting device including a mounting substrate and a semiconductor light emitting element disposed on the mounting substrate and emitting light when an electrical signal is applied thereto. The semiconductor light emitting element includes a light emitting structure including a first conductivity type semiconductor layer, an active layer and a second conductivity type semiconductor layer. A first electrode structure includes a conductive via penetrating the second conductivity type semiconductor layer and the active layer and connected to the first conductivity type semiconductor layer. A second electrode structure is connected to the second conductivity type semiconductor layer. An insulating part having an open region exposes part of the first and second electrode structures while covering the first and second electrode structures. First and second pad electrodes are formed on the first and second electrode structures and are exposed by the open region and connected to the first and second electrode structures.

The mounting substrate may be a circuit substrate.

The mounting substrate may be a lead frame.

The first and second pad electrodes may be disposed in a direction toward the mounting substrate.

According to an aspect of the present invention, there is provided a method of manufacturing a semiconductor light emitting element. The method includes preparing a light emitting structure including a first conductivity type semiconductor layer, an active layer and a second conductivity type semiconductor layer. A first electrode structure is formed on the light emitting structure. The first electrode structure includes a conductive via penetrating the second conductivity type semiconductor layer and the active layer and being connected to the first conductivity type semiconductor layer. A second electrode structure is formed on the light emitting structure, the second electrode structure being connected to the second conductivity type semiconductor layer. An insulating part having an open region exposing part of the first and second electrode structures while covering the first and second electrode structures is formed. First and second pad electrodes are formed on the first and second electrode structures exposed by the open region to be connected to the first and second electrode structures.

The forming of the insulating part may include forming the insulating part by filling an inside of the light emitting structure in order to electrically separate the conductive via, the active layer and the second conductivity type semiconductor layer from the second electrode structure. Part of the first and second electrode structures are exposed by removing part of the insulating part filling the inside of the light emitting structure. First and second electrode connection parts are formed on the exposed part of the first and second electrode structures. An insulating part is formed to cover the first and second electrode connection parts.

The open region may be formed by removing part of the additionally formed insulating part.

The first and second pad electrodes may be formed to have substantially the same area.

The second pad electrode may be formed above the first electrode structure.

BRIEF DESCRIPTION OF THE DRAWINGS

The above and other aspects and features of the present invention will be more clearly understood from the following detailed description taken in conjunction with the accompanying drawings, in which:

FIGS. 12A and 12B are micrographs illustrating examples of a semiconductor light emitting element according to an exemplary embodiment of the present invention;

DETAILED DESCRIPTION OF THE EMBODIMENTS

Figure 1:
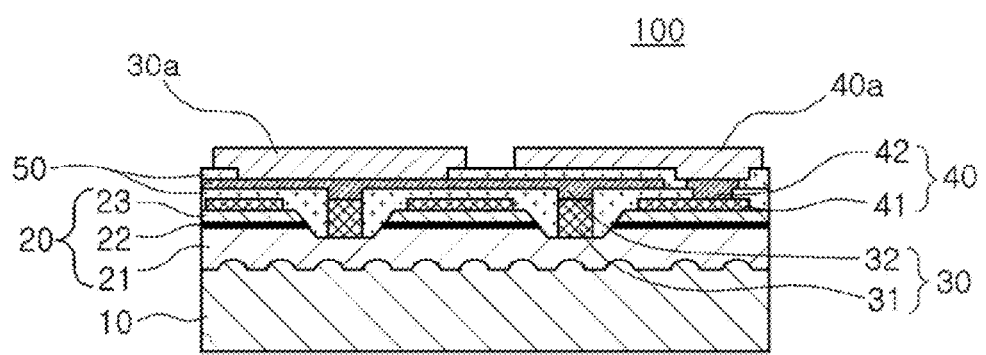
FIG. 1 is a schematic cross-sectional view of a semiconductor light emitting element according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals may be used throughout to designate the same or like elements.

Figure 2:
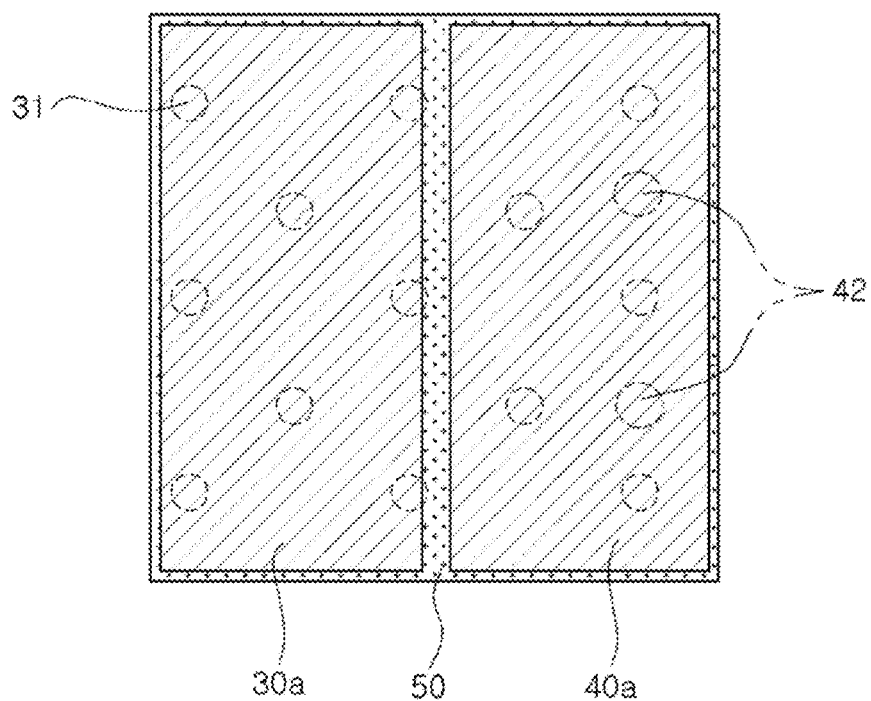
FIG. 2 is a schematic plan view of a semiconductor light emitting element according to an exemplary embodiment of the present invention.

FIG. 1 is a schematic cross-sectional view of a semiconductor light emitting element according to an exemplary embodiment of the present invention, and FIG. 2 is a schematic plan view of a semiconductor light emitting element according to an exemplary embodiment of the present invention.

With reference to FIGS. 1 and 2, a semiconductor light emitting element 100 according to an exemplary embodiment of the present invention may include a light emitting structure 20 disposed on a surface of a substrate 10. First and second electrode structures 30 and 40 are disposed opposite to the substrate 10 based on the light emitting structure 20. An insulating part 50 covers the first and second electrode structures 30 and 40. First and second pad electrodes 30a and 40a are connected to the first and second electrode structures 30 and 40, respectively.

According to an exemplary embodiment of the present invention, the light emitting structure 20 may include a first conductivity type semiconductor layer 21, an active layer 22 and a second conductivity type semiconductor layer 23 sequentially disposed on the substrate 10. The first electrode structure 30 may include a conductive via 31 penetrating the second conductivity type semiconductor layer 23 and the active layer 22 and connected to the first conductivity type semiconductor layer 21. The second electrode structure 40 may be connected to the second conductivity type semiconductor layer 23.

The insulating part 50 may include an open region allowing at least part of the first and second electrode structures 30 and 40 to be exposed. The first and second pad electrodes 30a and 40a may be connected to the first and second electrode structures 30 and 40, respectively.

The substrate 10 may be a semiconductor growth substrate formed of sapphire, SiC, $MgAl_2O_4$, MgO, $LiAlO_2$, $LiGaO_2$, GaN or the like. In this case, sapphire is a crystal having Hexa-Rhombo R3C symmetry and has a lattice constant of 13.001 Å along a C-axis and a lattice constant of 4.758 Å along an A-axis. Orientation planes of the sapphire include a C (0001) plane, an A (1120) plane, an R (1102) plane, and the like. Particularly, the C plane is mainly used as a substrate for nitride growth because it relatively facilitates the growth of a nitride film and is stable at a high temperature.

A buffer layer may be formed between the light emitting structure 20 and the substrate 10. The buffer layer may include an undoped semiconductor layer formed of nitride or the like to alleviate lattice defects of the light emitting structure to be grown thereon.

The substrate 10 may have first and second main surfaces facing each other. At least one of the first and second main surfaces may have an uneven structure formed thereon. The uneven structure may be formed on one surface of the substrate 10 by etching portions of the substrate 10 and may be formed of the same material as that of the substrate 10. Alternatively, the uneven structure may be formed of a different material from that of the substrate 10.

Since a path of light emitted from the active layer 22 may be varied by forming the uneven structure on an interface between the substrate 10 and the first conductivity type semiconductor layer 21, a light absorption rate inside the semiconductor layers may be reduced and a light scattering rate may be increased, whereby light extraction efficiency may be enhanced.

Specifically, the uneven structure may have a regular or irregular shape. The uneven structure and the substrate 10 may be formed of different materials having different refractive indices such that an effect of altering directions in which light moves may be maximized due to a difference in the refractive indices of the different materials forming the substrate 10, the first conductivity type semiconductor layer 21 and the uneven structure.

The material for forming the uneven structure may include a transparent conductor or a transparent insulator. The transparent insulator may include $SiO_2$, $SiN_x$, $Al_2O_3$, HfO, $TiO_2$, ZrO or the like, and the transparent conductor may include a transparent conductive oxide (TCO) such as a zinc oxide or an indium oxide containing an additive such as Mg, Ag, Zn, Sc, Hf, Zr, Te, Se, Ta, W, Nb, Cu, Si, Ni, Co, Mo, Cr, or Sn. However, the invention is not limited thereto.

In addition, the uneven structure formed on a top surface of the substrate 10 may alleviate stress caused by a difference in crystalline constants on the interface between the substrate 10 and the first conductivity type semiconductor layer 21. Specifically, in a case in which a group-III nitride semiconductor layer is grown on a sapphire substrate, a difference in lattice constants between the substrate and the group-III nitride semiconductor layer causes crystalline defects such as dislocations. The dislocations may spread upwardly to degrade the crystalline quality of the semiconductor layer.

According to exemplary embodiments of the present invention, the uneven structure including a convex portion having an inclined lateral surface is provided on the substrate 10. The first conductivity type semiconductor layer 21 is grown on the lateral surface of the convex portion, thereby preventing the dislocations from spreading upwardly. Therefore, a high-quality nitride semiconductor light emitting element may be provided and internal quantum efficiency may be increased therein. However, the uneven structure is not necessarily required and it may be selectively utilized if necessary.

The first conductivity type semiconductor layer 21, the active layer 22 and the second conductivity type semiconductor layer 23 of the light emitting structure 20 are disposed on the substrate 10. However, the entirety of or a portion of the substrate 10 may be removed.

The first and second conductivity type semiconductor layers 21 and 23 forming the light emitting structure 20 may be n-type and p-type semiconductor layers, respectively, and may be formed of a nitride semiconductor. The first and second conductivity types may refer to n-type and p-type, respectively, however, the present invention is not limited thereto. The first and second conductivity type semiconductor layers 21 and 23 may have a composition formula of $Al_xIn_yGa_{(1-x-y)}N$ ($0 \leq x \leq 1$, $0 \leq y \leq 1$, $0 \leq x+y \leq 1$). For example, GaN, AlGaN, InGaN or the like may be used.

The active layer 22 formed between the first conductivity type semiconductor layer 21 and the second conductivity type semiconductor layer 23 emits light having a predetermined level of energy through electron-hole recombination. The active layer 22 may have a multi-quantum well (MQW) structure in which quantum well layers and quantum bather layers are alternately stacked. The multi-quantum well structure may employ an InGaN/GaN structure, for example. The first and second conductivity type semiconductor layers 21 and 23 and the active layer 22 may be formed by using a known semiconductor-layer growth technique such as metal-organic chemical vapor deposition (MOCVD), molecular beam epitaxy (MBE), hydride vapor phase epitaxy (HVPE), or the like.

The first and second electrode structures 30 and 40 may be provided to electrically connect the first and second conductivity type semiconductor layers 21 and 23 to the outside. The first and second electrode structures 30 and 40 may be disposed opposite to the substrate 10 based on the light emitting structure 20, and may be connected to the first and second conductivity type semiconductor layers 21 and 23, respectively.

The first and second electrode structures 30 and 40 may have a single-layer or multilayer structure formed of a conductive material having ohmic characteristics with the first and second conductivity type semiconductor layers 21 and 23. For example, the first and second electrode structures 30 and 40 may be formed by depositing or sputtering at least one of Ag, Al, Ni, Cr, TCO or the like. The first and second electrode structures 30 and 40 may be disposed in the same direction. As is described below, the first and second electrode structures 30 and 40 may be mounted on a lead frame or the like in a flip-chip manner. In this case, the first and second electrode structures 30 and 40 may be disposed in the same direction.

The first electrode structure 30 may include the conductive via 31 penetrating the second conductivity type semiconductor layer 23 and the active layer 22 and contacting the first conductivity type semiconductor layer 21 within the light emitting structure 20, and a first electrode connection part 32 connected to the conductive via 31.

To reduce contact resistance between the conductive via 31 and the first conductivity type semiconductor layer 21, the contact area therebetween and the number, shape, pitch and the like of conductive vias may be appropriately adjusted. Further, the conductive vias 31 may be arrayed in rows and columns to thereby increase the flow of current. In this case, the conductive via 31 may be surrounded by the insulating part 50 such that it may be electrically separated from the active layer 22 and the second conductivity type semiconductor layer 23.

A conductive contact layer for ohmic contact may be further included between the conductive via 31 and the first conductivity type semiconductor layer 21. The conductive contact layer may include Ag, Ni, Al, Rh, Pd, Ir, Ru, Mg, Zn, Pt, Au or the like, and may have a double-layer structure such as Ni/Ag, Zn/Ag, Ni/Al, Zn/Al, Pd/Ag, Pd/Al, Ir/Ag, Ir/Au, Pt/Ag, Pt/Al, Ni/Ag/Pt or the like.

The second electrode structure 40 may include a second electrode layer 41 directly formed on the second conductivity type semiconductor layer 23 and a second electrode connection part 42 formed on the second electrode layer 41. The second electrode layer 41 may serve to form electrical ohmic contact with the second conductivity type semiconductor layer 23. In addition, the second electrode layer 41 may be formed of a light reflective material such that it may deflect light emitted from the active layer 22 toward the substrate 10 when the light emitting element 100 is mounted to have the flip-chip structure. However, the second electrode layer 41 is not necessarily formed of the light reflective material, and it may be formed of a transparent conductive oxide or the like.

The first and second electrode connection parts 32 and 42 may be formed of the same material as that of the conductive via 31 and the second electrode layer 41. Alternatively, they may be formed of different materials. For example, in a case in which the second electrode layer 41 is formed of a light transmissive material, the second electrode connection part 42 may be formed of a light reflective material.

The first and second electrode structures 30 and 40 may be electrically separated from each other by the insulating part 50. The insulating part 50 may be formed of any material having electrical insulating characteristics. Although any material having electrical insulating characteristics may be used, it may be preferable for the material to have minimal light absorption. For example, a silicon oxide or a silicon nitride such as $SiO_2$, $SiO_xN_y$, $Si_xN_y$ or the like may be used. Further, such a light transmissive material may have a light reflective filler dispersed therein, thereby forming a light reflective structure.

Specifically, the insulating part 50 may be provided to fill a space between the conductive via 31 and the second electrode layer 41 and may electrically separate the conductive via 31 from the second conductivity type semiconductor layer 23 and the active layer 22, and may be formed to cover the first and second electrode connection parts 32 and 42. The insulating part 50 may have an open region allowing at least part of the first and second electrode connection parts 32 and 42 to be exposed and electrically connected to the outside thereby.

The first and second pad electrodes 30a and 40a may be connected to the first and second electrode connection parts 32 and 42, respectively, and may function as external terminals of the light emitting element 100. The first and second pad electrodes 30a and 40a may be formed to have a single layer or two or more layers. In the case in which the first and second pad electrodes 30a and 40a are formed to have two layers, a lower layer of the two layers, for example, a portion formed in the open region of the insulating part 50 and contacting the electrode connection part and an upper layer thereof may be formed of the same material or different materials.

The first and second pad electrodes 30a and 40a may be formed of an eutectic metal such as AuSn or the like. When the first and second pad electrodes 30a and 40a are mounted in a package or the like, they may be bonded by eutectic bonding, and accordingly, a solder bump normally required in the case of flip-chip bonding is not required. In the case of the mounting method using the eutectic metal as compared with using the solder bump, radiation of heat may be facilitated. In this case, in order to obtain a superior heat radiation effect, the first and second pad electrodes 30a and 40a may be formed to occupy a relatively wide area.

The insulating part 50 may be formed to have the open region exposing at least part of the first and second electrode structures 30 and 40 while covering the first and second electrode structures 30 and 40. The size and shape of the first and second pad electrodes 30a and 40a may be freely designed.

For example, since the insulating part 50 may be formed to cover upper surfaces of the first and second electrode connection parts 32 and 42, there is no limitation in the locations of the first and second pad electrodes 30a and 40a. Therefore, the degree of freedom in designing the pad electrodes may be increased. Also, as shown in FIG. 2, since the first electrode structure 30 can be disposed below the second pad electrode 40a, current distribution efficiency through the conductive via 31 may be maximized. In the case in which the first and second pad electrodes 30a and 40a are formed to have substantially the same area, current injection efficiency and current distribution efficiency may be enhanced.

FIGS. 3A through 11B are views illustrating a method of manufacturing a semiconductor light emitting element according to an exemplary embodiment of the present invention. Specifically, these figures show a process for manufacturing the light emitting element of FIGS. 1 and 2.

Figure 3A:
FIGS. 3A and 3B are views illustrating a method of manufacturing a semiconductor light emitting element according to an exemplary embodiment of the present invention.
Figure 3B:
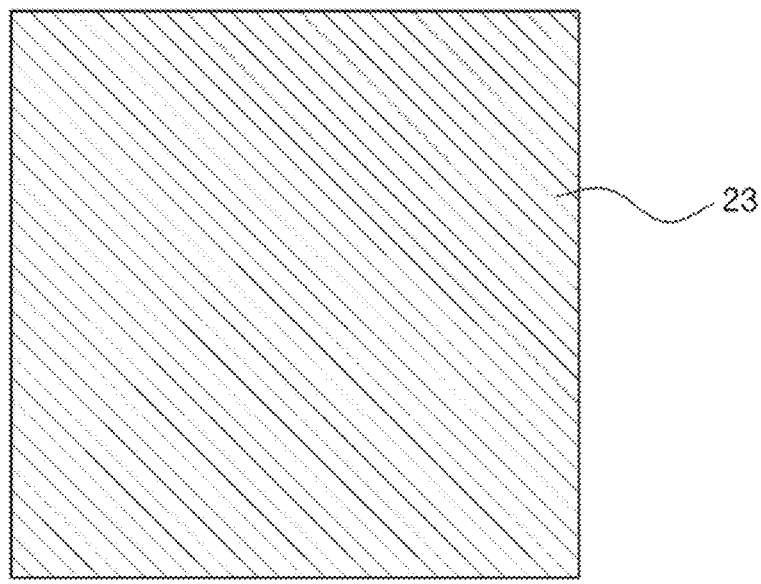

In the method of manufacturing the semiconductor light emitting element according to an exemplary embodiment, as shown in FIGS. 3A AND 3B, the substrate 10 may be prepared to have the uneven structure formed on at least one of the first and second main surfaces thereof. The light emitting structure 20 including the first conductivity type semiconductor layer 21, the active layer 22 and the second conductivity type semiconductor layer 23 may be formed on the first main surface of the substrate 10. As described above, the substrate 10 may be formed of sapphire, SiC, $MgAl_2O_4$, MgO, $LiAlO_2$, $LiGaO_2$, GaN or the like. The uneven structure formed on the upper surface of the substrate 10 may be obtained by forming a photo-resist layer on the substrate 10, forming patterns by radiating light onto the photo-resist layer, and forming the uneven structure corresponding to the patterns by dry etching or wet etching.

Although FIGS. 3A and 3B show that the uneven structure is formed directly on the surface of the substrate 10, the uneven structure may be formed as a separate uneven structure using a different material from that of the substrate 10, for example, a transparent insulator, a transparent conductor or the like.

The dry etching for forming the uneven structure may be performed using an etching gas such as a fluorine-based gas such as $CF_4$ or $SF_6$, a chlorine-based gas such as $Cl_2$ or $BCl_3$, or an Ar gas. However, the etching gas is not limited thereto, and various etching gases known in the art may be used.

In the case in which the first conductivity type semiconductor layer 21 is grown on the substrate 10 having the uneven structure formed thereon, the first conductivity type semiconductor layer 21 is grown on the lateral surface of the convex portion of the uneven structure. The dislocations due to a difference in lattice constants between the light transmissive substrate 10 and the first conductivity type semiconductor layer 21 may be prevented from spreading upwardly. The dislocations may be bent toward the lateral surface since the first conductivity type semiconductor layer 21 is grown on the lateral surface. Therefore, dislocation density may be significantly reduced within the grown first conductivity type semiconductor layer 21 in a direction parallel to the main surface of the substrate 10, whereby a high-quality nitride semiconductor light emitting element may be manufactured.

Figure 4A:
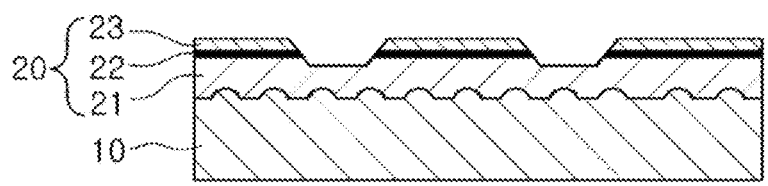
FIGS. 4A and 4B are views illustrating a method of manufacturing a semiconductor light emitting element according to an exemplary embodiment of the present invention.
Figure 4B:
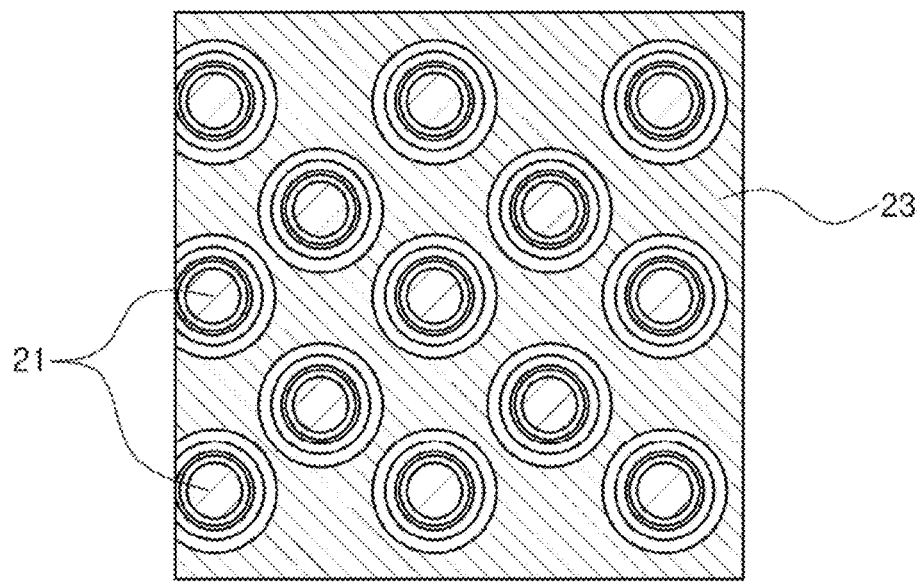

As shown in FIGS. 4A and 4B, the first conductivity type semiconductor layer 21, the active layer 22 and the second conductivity type semiconductor layer 23 may be partially etched to expose at least part of the first conductivity type semiconductor layer 21. The surface of the first conductivity type semiconductor layer 21 exposed by the etching process may be used for forming the conductive via 31. Similar to the formation of the uneven structure on the substrate, a region of the first conductivity type semiconductor layer 21 except for the region for forming the conductive via 31 may be subjected to a masking process and wet etching or dry etching may be performed to thereby form a hole-type etched region.

Figure 5A:
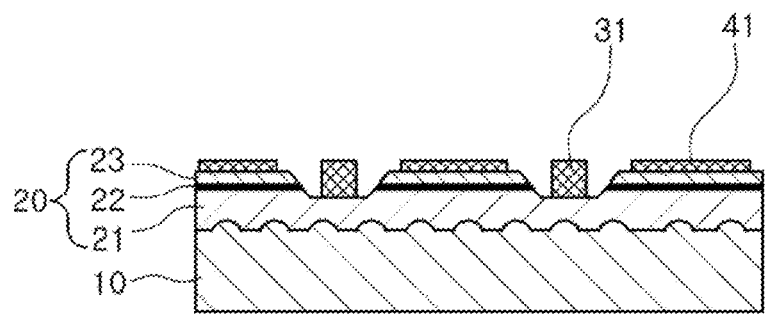
FIGS. 5A and 5B are views illustrating a method of manufacturing a semiconductor light emitting element according to an exemplary embodiment of the present invention.
Figure 5B:
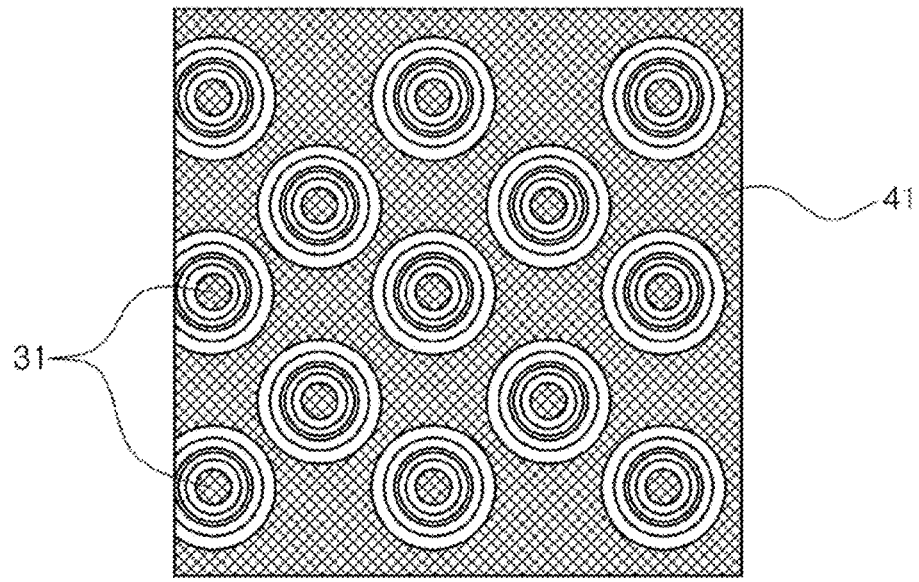

Thereafter, as shown in FIGS. 5A and 5B, the first and second electrode structures, namely, the conductive via 31 and the second electrode layer 41 may be respectively formed on the first conductivity type semiconductor layer 21 and the second conductivity type semiconductor layer 23 exposed by removing part of the first conductivity type semiconductor layer 21, the active layer 22 and the second conductivity type semiconductor layer 23.

The conductive via 31 and the second electrode layer 41 may be formed of the same material, and upper surfaces thereof may be disposed on the same level as shown in FIG. 5A. Also, as shown in FIG. 5B, the second electrode layer 41 may be integrally formed to surround the conductive via 31.

According to exemplary embodiments of the present invention, the plurality of conductive vias 31 may be formed. However, the number, shape, pitch and the like of conductive vias may be appropriately changed if necessary. Since the first and second electrode structures 30 and 40 serve to apply electricity to the first and second conductivity type semiconductor layers 21 and 23, they may be formed of a metallic material having superior electrical conductivity.

Specifically, the conductive via 31 may have a stack structure in which Al/Ti/Pt/Ti are sequentially stacked, and the second electrode layer 41 may have a stack structure in which Ag/Ni/Ti/TiN are sequentially stacked. However, this is merely an example, and the materials for the first and second electrode structures may be appropriately selected from metals known in the art.

Figure 6A:
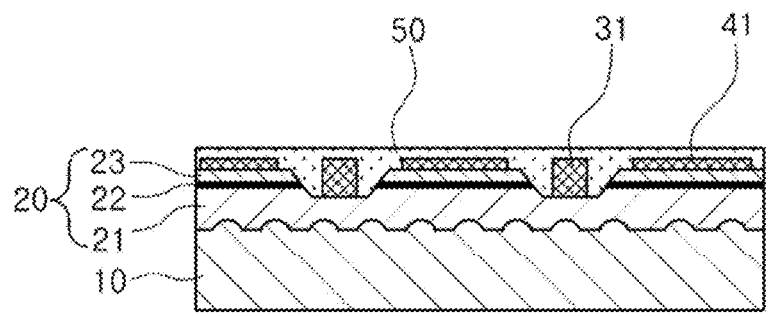
FIGS. 6A and 6B are views illustrating a method of manufacturing a semiconductor light emitting element according to an exemplary embodiment of the present invention.
Figure 6B:
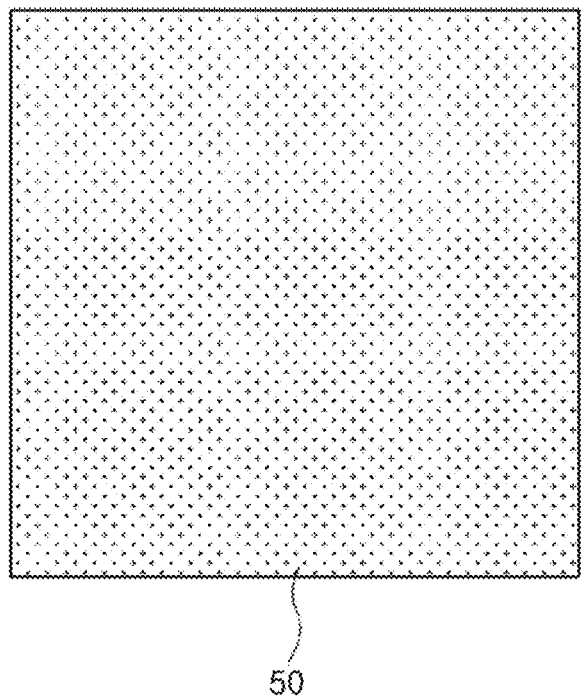

As shown in FIGS. 6A and 6B, the insulating part 50 may be formed to cover the surface of the light emitting structure 20. The insulating part 50 may fill the inside of the light emitting structure 20 to electrically separate the first electrode structure including the conductive via 31 from the active layer 22, the second conductivity type semiconductor layer 23 and the second electrode structure, while covering the first and second electrode structures.

The insulating part 50 may be formed of a silicon oxide or a silicon nitride such as $SiO_2$, $SiO_xN_y$, $Si_xN_y$ or the like. The insulating part 50 may be formed to have a thickness of approximately 6000 Å using a deposition process such as plasma enhanced chemical vapor deposition (PECVD).

Figure 7A:
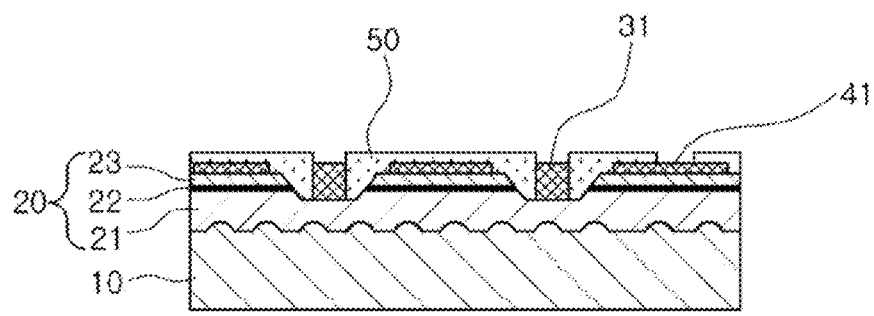
FIGS. 7A and 7B are views illustrating a method of manufacturing a semiconductor light emitting element according to an exemplary embodiment of the present invention.
Figure 7B:
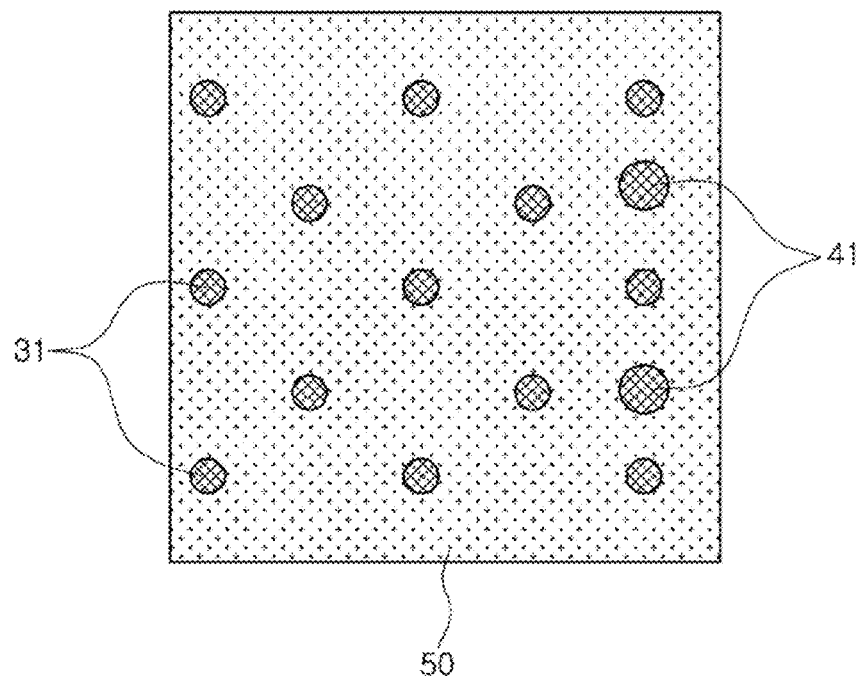

Next, as shown in FIGS. 7A and 7B, part of the insulating part 50 may be removed to expose at least part of the first and second electrode structures. For example, in order to individually make electrical connections to the first and second electrode structures, at least part of the conductive via 31 and at least part of the second electrode layer 41 may be exposed by a known etching process.

Figure 8A:
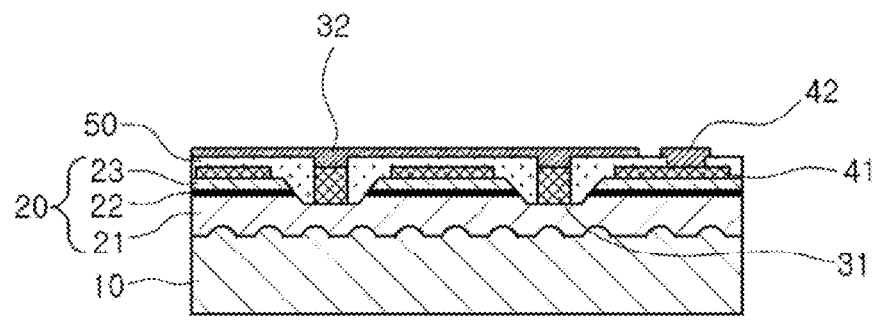
FIGS. 8A and 8B are views illustrating a method of manufacturing a semiconductor light emitting element according to an exemplary embodiment of the present invention.
Figure 8B:
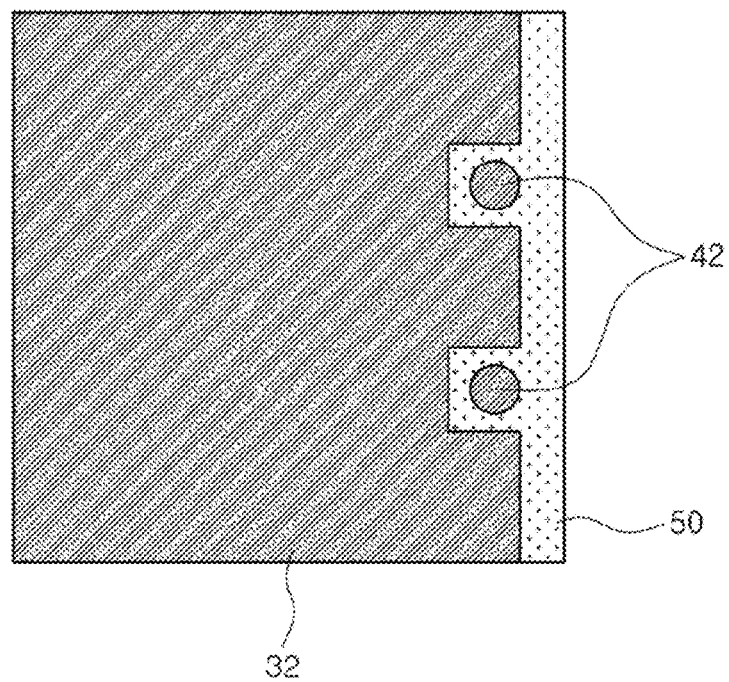

Then, as shown in FIGS. 8A and 8B, the first and second electrode connection parts 32 and 42 may be formed on the insulating part 50 to be electrically connected to the conductive via 31 and the second electrode layer 41, respectively. The first and second electrode connection parts 32 and 42 may be formed by depositing, sputtering, plating or other similar techniques known in the art. The first electrode connection part 32 may be provided to connect the plurality of conductive vias 31, and the shape thereof may be varied.

To effectively facilitate the process, the first and second electrode connection parts 32 and 42 may be formed of the same material, and as shown in FIG. 8A, upper surfaces thereof may be disposed on the same level.

Figure 9A:
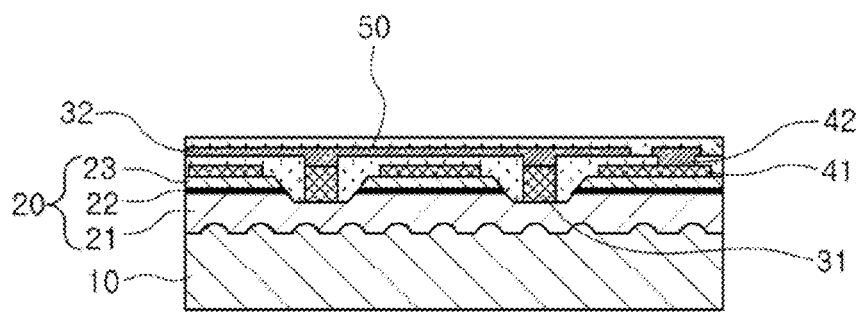
FIGS. 9A and 9B are views illustrating a method of manufacturing a semiconductor light emitting element according to an exemplary embodiment of the present invention.
Figure 9B:
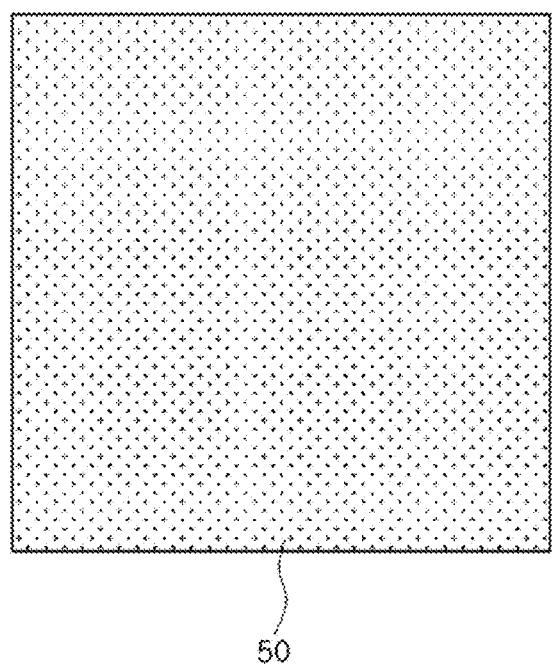
Figure 10A:
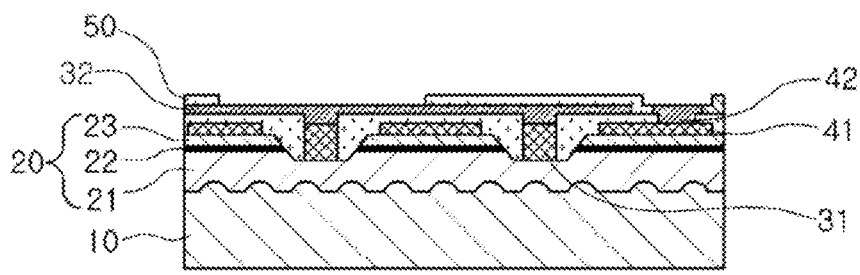
FIGS. 10A and 10B are views illustrating a method of manufacturing a semiconductor light emitting element according to an exemplary embodiment of the present invention.
Figure 10B:
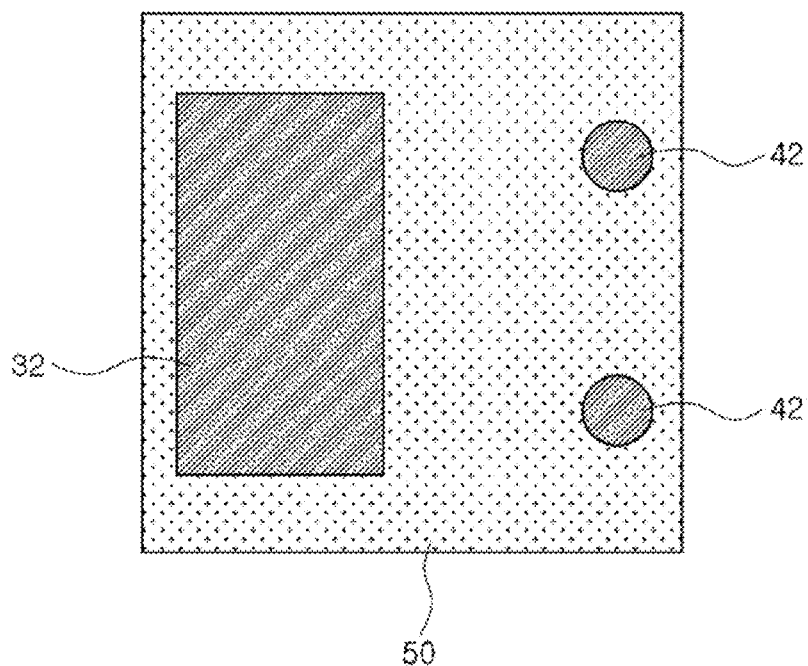

Then, the insulating part 50 may additionally be formed as shown in FIGS. 9A and 9B and part thereof may be removed to form the open region exposing part of the first and second electrode connection parts 32 and 42 as shown in FIGS. 10A and 10B. The additionally formed insulating part 50 may be provided to ensure the degree of freedom in designing the first and second pad electrodes to be formed thereon. As shown in FIG. 10B, part of the insulating part 50 may be removed to expose part of the first and second electrode connection parts 32 and 42, thereby obtaining a region for connection to the pad electrodes. Therefore, the shape of the exposed region of the first and second electrode connection parts 32 and 42 is not limited to that shown in FIGS. 10A and 10B, and it may be varied if necessary.

Figure 11A:
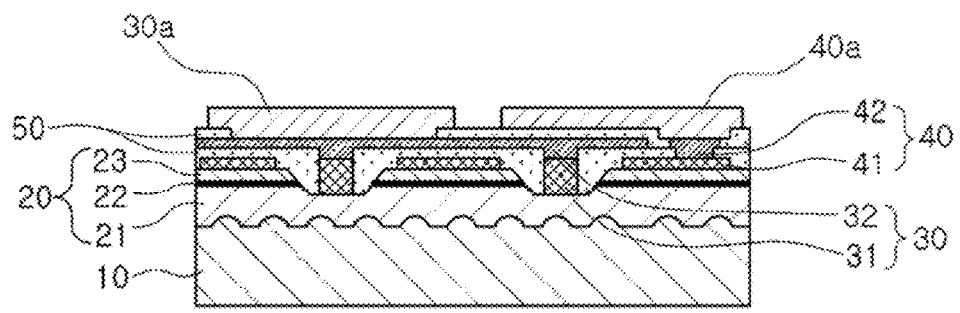
FIGS. 11A and 11B are views illustrating a method of manufacturing a semiconductor light emitting element according to an exemplary embodiment of the present invention.
Figure 11B:
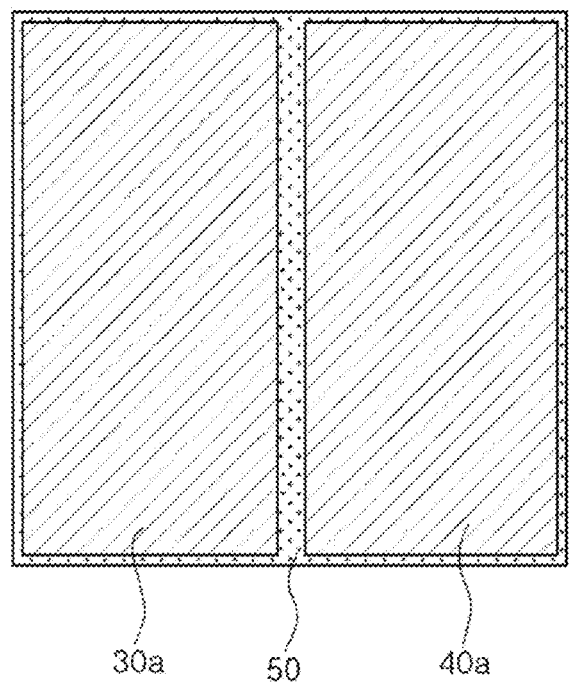

Then, as shown in FIGS. 11A and 11B, the first and second pad electrodes 30a and 40a may be formed connected to the first and second electrode connection parts 32 and 42, respectively. As described above, the first and second pad electrodes 30a and 40a may be formed of a eutectic metal such as AuSn or the like. When the first and second pad electrodes 30a and 40a are mounted in a package or the like, they may be bonded by eutectic bonding, and accordingly, there is no need for a solder bump normally required in the case of flip-chip bonding. In the case of the mounting method using the eutectic metal as compared with using the solder bump, the radiation of heat may be enhanced. In this case, in order to obtain a superior heat radiation effect, the first and second pad electrodes 30a and 40a may be formed to occupy a relatively wide area.

Further, since the first and second pad electrodes 30a and 40a may be formed on the insulating part 50, the shape thereof is not limited. Therefore, as shown in FIG. 11B, the first and second pad electrodes 30a and 40a may be formed to have substantially the same area. In addition, since there is no limitation in the locations of the first and second electrode structures 30 and 40, the first electrode structure 30 may be also disposed below the second pad electrode 40a. Accordingly, current distribution efficiency and current injection efficiency may be enhanced, so that a semiconductor light emitting element having increased light output and light uniformity may be provided.

FIGS. 12A and 12B are micrographs illustrating inventive and comparative examples of a semiconductor light emitting element according to an exemplary embodiment of the present invention. Specifically, FIG. 12A shows a comparative example of a semiconductor light emitting element in which a first electrode structure (a conductive via) is not disposed below a second pad electrode connected to a second conductivity type semiconductor layer, and FIG. 12B is an inventive example of a semiconductor light emitting element in which an additional insulating part is further formed and a first electrode structure (a conductive via) is also disposed below a second pad electrode.

As shown in FIG. 12A, in the case in which the second pad electrode is directly connected to the second conductivity type semiconductor layer through the second electrode structure, the second pad electrode is only disposed in a partial region A in which the first electrode structure (the conductive via) is not formed. Accordingly, the light emitting characteristics in the region A in which the second pad electrode is formed, may be deteriorated.

According to exemplary embodiments of the present invention, the first electrode structure (the conductive via) may be disposed at regular intervals within the light emitting structure, and accordingly, light may be uniformly emitted from the entirety of the light emitting element as shown in FIG. 12B.

Further, as a result of comparison between the inventive and comparative examples in terms of operating voltage and luminance when a current of 350 mA may be injected thereto, the comparative example of FIG. 12A has an operating voltage of 3.40 V and a light output of 426 mW, while the inventive example of FIG. 12B has an operating voltage of 3.34 V and a light output of 443 mW. Accordingly, the inventive example may demonstrate superior operating voltage and luminance.

The semiconductor light emitting element having the above-described structure may be disposed on a mounting substrate or the like to be used as a light emitting device. Here, the light emitting device may include display devices such as a backlight unit, indoor/outdoor illumination devices, headlights, and the like.

Figure 13:
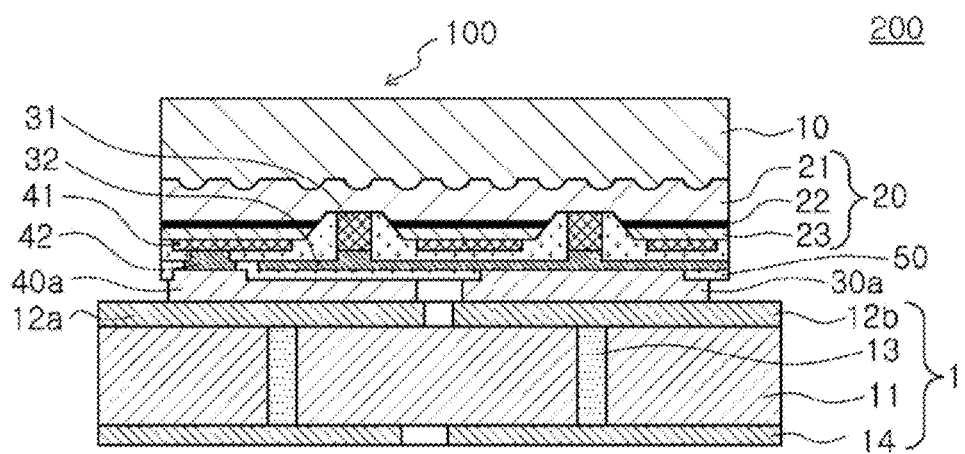
FIG. 13 is a schematic cross-sectional view of a light emitting device according to an exemplary embodiment of the present invention.

A detailed description thereof will be provided with reference to FIG. 13. FIG. 13 is a schematic cross-sectional view of a light emitting device according to an exemplary embodiment of the present invention.

A light emitting device 200 has the semiconductor light emitting element 100 mounted on a substrate. For example, the light emitting device 200 may include a mounting substrate 1 and the semiconductor light emitting element 100 disposed on the mounting substrate 1. The semiconductor light emitting element 100 may have the structure illustrated in FIGS. 1 and 2. The semiconductor light emitting element 100 may have the first and second pad electrodes 30a and 40a disposed in a direction toward the mounting substrate 1 in a flip-chip manner. For example, the first and second pad electrodes 30a and 40a may be disposed in the direction toward the mounting substrate 1, and in this case, they may be bonded to the mounting substrate 1 by eutectic bonding, such that superior heat radiation efficiency may be achieved as compared with the use of a solder bump. Therefore, the light emitting device 200 according to an exemplary embodiment of the present invention does not need wire bonding, whereby the deterioration of reliability due to defects in wire processing may be avoided.

The mounting substrate 1 may include first and second electrode patterns 12a and 12b formed on at least one surface thereof. The semiconductor light emitting element 100 may be disposed on the surface of the mounting substrate 1 on which the first and second electrode patterns 12a and 12b are formed, and accordingly, an electrical signal may be applied to the semiconductor light emitting element 100 through the first and second electrode patterns 12a and 12b.

The mounting substrate 1 may include a substrate main body 11, the first and second electrode patterns 12a and 12b formed on one surface of the substrate main body 11, a plurality of vias 13 penetrating the substrate main body 11 in a thickness direction thereof, and a lower electrode 14 formed on the other surface of the substrate main body 11. Here, the plurality of vias 13 may electrically connect the first and second electrode patterns 12a and 12b to the lower electrode 13, and may serve to radiate heat generated in the semiconductor light emitting element 100 outwardly.

The substrate main body 11 may be formed of an organic resin material containing epoxy, triazine, silicone, polyimide or the like and other organic resin materials, a ceramic material such as AlN, $Al_2O_3$ or the like, or a metal and a metallic compound. Further, the substrate 1 may be a printed circuit board (PCB) having an electrode pattern formed on one surface thereof.

For example, the substrate main body 11 may have the semiconductor light emitting element 100 disposed on the upper surface thereof on which the first and second electrode patterns 12a and 12b are formed, and have a wiring structure for supplying power to the semiconductor light emitting element 100 and a separate power supply device formed on the lower surface of the substrate main body 11 opposite to the upper surface on which the semiconductor light emitting element 100 is disposed.

Although FIG. 13 shows that the mounting substrate 1 includes the via 13 penetrating the substrate main body 11, the present invention is not limited thereto. As the mounting substrate 1 applicable to the present embodiment, any substrate having a wiring structure for driving the light emitting element 100 on both the surface thereof on which the light emitting element 100 is disposed and the opposing surface thereto may be used.

Specifically, the wirings may be formed on the surface and the opposing surface of the substrate 1 for electrically connecting the respective light emitting elements. The wiring formed on the upper surface of the substrate main body 11 may be connected to the wiring formed on the opposing surface through the first and second electrode patterns 12a and 12b connected to the first and second pad electrodes 30a and 40a of the light emitting element 100.

The first and second electrode patterns 12a and 12b and the lower electrode 14 formed on the substrate main body 11 may be formed by plating a metallic material such as Au, Cu or the like on the upper surface of the substrate main body 11 formed of a resin or ceramic material.

Meanwhile, the light emitting device of FIG. 13 may be modified to have various forms. For example, the light emitting device may be provided to have a package structure in which the first and second pad electrodes 30a and 40a of the light emitting element is mounted on a pair of lead frames.

Figure 14:
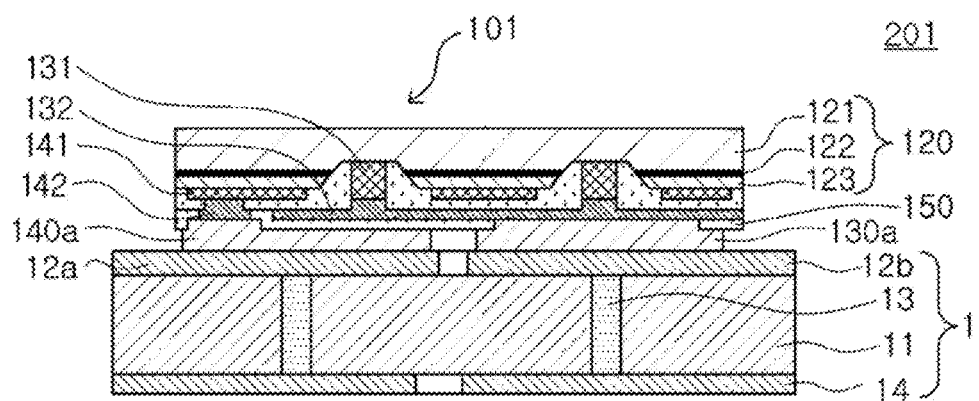
FIG. 14 is a schematic cross-sectional view of a light emitting device according to an exemplary embodiment of the present invention.

FIG. 14 is a schematic cross-sectional view of a light emitting device according to an exemplary embodiment of the present invention.

A light emitting device 201 according to an exemplary embodiment of the present invention is different from the light emitting device 200 of FIG. 13 in terms of the structure of a light emitting element 101. Therefore, only the different configuration will be described below. Features not discussed may be assumed to be similar or identical to features discussed above.

The light emitting device 201 may include the light emitting element 101 disposed on the mounting substrate 1. The light emitting element 101 may include a light emitting structure 120, first electrode structures 131 and 132, second electrode structures 141 and 142, an insulating part 150 covering the first and second electrode structures, and first and second pad electrodes 130a and 140a connected to the first and second electrode structures 131, 132, 141 and 142, respectively.

Unlike the structure of FIG. 13, the light emitting element 101 of FIG. 14 does not include a semiconductor growth substrate, and a surface of the light emitting structure 120 opposite to a surface thereof on which the first and second electrode structures 131, 132, 141 and 142 and the first and second pad electrodes 130a and 140a are formed, namely, a first conductivity type semiconductor layer 121 may be exposed outwardly.

The semiconductor growth substrate may be removed during the manufacturing process of the light emitting element 101 or in a state in which the light emitting element 101 is mounted on the substrate 1 after the manufacturing process thereof. Here, the removal process may be performed by a wet etching process, a dry etching process or a laser lift off (LLO) process known in the art. In this case, as shown in FIG. 14, the entirety of the substrate may be removed. Alternatively, part of the substrate may only be removed. Further, an uneven structure may be formed on the surface of the light emitting structure 120 or the surface of the substrate, whereby light extraction efficiency may be improved.

As set forth above, in a semiconductor light emitting element according to exemplary embodiments of the invention, a degree of freedom in designing electrodes may be increased and current distribution may be enhanced.

In a semiconductor light emitting element according to exemplary embodiments of the invention, operating voltage may be reduced and light output may be increased.

In a light emitting device according to exemplary embodiments of the invention, heat radiation and reliability may be enhanced.

A method of manufacturing a semiconductor light emitting element according to exemplary embodiments of the invention may allow for an increased degree of freedom in terms of a design thereof.

While the present invention has been shown and described in connection with the exemplary embodiments, it will be apparent to those skilled in the art that modifications and variations can be made without departing from the spirit and scope of the present invention.

What is claimed is:

1. A semiconductor light emitting element comprising:
 a light emitting structure including a first conductivity type semiconductor layer, an active layer and a second conductivity type semiconductor layer;
 a first electrode structure including a plurality of conductive vias penetrating the second conductivity type semiconductor layer and the active layer, the plurality of conductive vias connected to the first conductivity type semiconductor layer;
 a second electrode structure connected to the second conductivity type semiconductor layer;
 an insulating part covering the first and second electrode structures and having an open region exposing part of the first and second electrode structures; and
 first and second pad electrodes formed on the first and second electrode structures exposed by the open region, respectively, the first and second pad electrodes connected to the first and second electrode structures, respectively,
 wherein at least one of the plurality of conductive vias is disposed below the second pad electrode and is electrically insulated from the second pad electrode by the insulating part.

2. The semiconductor light emitting element of claim 1, wherein the first and second pad electrodes have substantially the same area.

3. The semiconductor light emitting element of claim 1, wherein the insulating part is disposed between the second pad electrode and the first electrode structure.

4. The semiconductor light emitting element of claim 1, wherein the insulating part fills spaces between the plurality of conductive vias and the light emitting structure.

5. The semiconductor light emitting element of claim 1, wherein the first and second electrode structures are disposed in the same direction.

6. The semiconductor light emitting element of claim 1, wherein the first electrode structure is surrounded by the insulating part and the first electrode structure is electrically separated from the active layer and the second conductivity type semiconductor layer.

7. The semiconductor light emitting element of claim 1, wherein at least part of the second electrode structure includes a light reflective material.

8. The semiconductor light emitting element of claim 1, wherein at least part of the second electrode structure surrounds at least one of the plurality of conductive vias.

9. The semiconductor light emitting element of claim 1, further comprising a substrate having the first conductivity type semiconductor layer, the active layer and the second conductivity type semiconductor layer sequentially formed thereon.

10. The semiconductor light emitting element of claim 9, wherein
 the substrate includes first and second main surfaces facing each other,
 the light emitting structure is disposed on the first main surface, and
 wherein the first main surface of the substrate is uneven.

11. The semiconductor light emitting element of claim 10, wherein the uneven structure formed on the substrate includes a convex portion having an inclined lateral surface.

12. A light emitting device comprising:
 a mounting substrate; and
 a semiconductor light emitting element disposed on the mounting substrate and emitting light when an electrical signal is applied thereto,
 wherein the semiconductor light emitting element includes:
 a light emitting structure including a first conductivity type semiconductor layer, an active layer and a second conductivity type semiconductor layer;
 a first electrode structure including a plurality of conductive vias penetrating the second conductivity type semiconductor layer and the active layer, the plurality of conductive vias connected to the first conductivity type semiconductor layer;
 a second electrode structure connected to the second conductivity type semiconductor layer;
 an insulating part covering the first and second electrode structures and having an open region exposing part of the first and second electrode structures; and
 first and second pad electrodes formed on the first and second electrode structures exposed by the open region, respectively, the first and second pad electrodes connected to the first and second electrode structures, respectively,
 wherein at least one of the plurality of conductive vias is disposed below the second pad electrode and is electrically insulated from the second pad electrode by the insulating part.

13. The light emitting device of claim 12, wherein the mounting substrate is a circuit substrate or a lead frame.

14. The light emitting device of claim 12, wherein the first and second pad electrodes are disposed in a direction toward the mounting substrate.

15. A semiconductor light emitting element, comprising:
 a light emitting structure including a first conductivity type semiconductor layer, an active layer and a second conductivity type semiconductor layer;

a first electrode structure electrically connected to the first conductivity type semiconductor layer;
a second electrode structure connected to the second conductivity type semiconductor layer;
a plurality of conductive vias penetrating the second conductivity type semiconductor layer and the active layer, the plurality of conductive vias connected to the first conductivity type semiconductor layer;
an insulating part covering the first and second electrode structures and having an open region exposing part of the first and second electrode structures; and
first and second pad electrodes connected to the first and second electrode structures, respectively, and exposed by the open region,
wherein at least one of the plurality of conductive vias is disposed below the second pad electrode and is electrically insulated from the second pad electrode by the insulating part.

16. The semiconductor light emitting element of claim 15, wherein the first and second pad electrodes have substantially the same area.

17. The semiconductor light emitting element of claim 15, wherein the insulating part fills spaces between the plurality of conductive vias and the light emitting structure.

18. The semiconductor light emitting element of claim 15, further comprising a substrate having the first conductivity type semiconductor layer, the active layer and the second conductivity type semiconductor layer sequentially formed on a surface thereof.

19. The semiconductor light emitting element of claim 1, wherein two or more conductive vias of the plurality of conductive vias are connected to one another by an electrode connection part.

* * * * *